US009880391B2

(12) United States Patent
Rossi

(10) Patent No.: US 9,880,391 B2
(45) Date of Patent: Jan. 30, 2018

(54) LENS ARRAY MODULES AND WAFER-LEVEL TECHNIQUES FOR FABRICATING THE SAME

(71) Applicant: Heptagon Micro Optics Pte. Ltd., Singapore (SG)

(72) Inventor: Markus Rossi, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/026,721

(22) PCT Filed: Sep. 5, 2014

(86) PCT No.: PCT/SG2014/000420
§ 371 (c)(1),
(2) Date: Apr. 1, 2016

(87) PCT Pub. No.: WO2015/050499
PCT Pub. Date: Apr. 9, 2015

(65) Prior Publication Data
US 2016/0252734 A1    Sep. 1, 2016

Related U.S. Application Data

(60) Provisional application No. 61/885,199, filed on Oct. 1, 2013.

(51) Int. Cl.
*H04N 5/225*    (2006.01)
*G02B 27/10*    (2006.01)
(Continued)

(52) U.S. Cl.
CPC ....... *G02B 27/1013* (2013.01); *G02B 3/0031* (2013.01); *G02B 3/0062* (2013.01);
(Continued)

(58) Field of Classification Search
CPC .... H04N 5/225; H04N 5/335; G02B 27/1013; G02B 17/08; H01L 27/14625; G11B 2007/1372
See application file for complete search history.

(56) References Cited

U.S. PATENT DOCUMENTS 3,814,504 A    6/1974 Brady et al.
6,137,535 A  * 10/2000 Meyers ................ G02B 3/0043
                                                         250/208.1
(Continued)

OTHER PUBLICATIONS

Australian Patent Office, International Search Report and Written Opinion, issued by ISA/AU in International Patent Application No. PCT/SG2014/000420 (dated Dec. 24, 2014).

*Primary Examiner* — Abdelaaziz Tissire
(74) *Attorney, Agent, or Firm* — Fish & Richardson P.C.

(57) ABSTRACT

A lens module includes a substrate, a first array of passive optical elements on the substrate, and a second array of passive optical elements separate from the first array. The optical elements of the first array and the optical elements of the second array form multiple optical channels, in which at least one optical channel is a catadioptric optical channel including a reflective optical element and a refractive optical element. The reflective optical element is arranged to reflect light toward the refractive optical element, each optical channel has a corresponding field-of-view, and the lens module has an overall field of view defined by the range of angles subtended by the field-of-view of the plurality of optical channels.

38 Claims, 10 Drawing Sheets

(51) Int. Cl.
  *G02B 17/08*   (2006.01)
  *H01L 27/146*  (2006.01)
  *G02B 3/00*    (2006.01)
  *G02B 13/00*   (2006.01)
  *G02B 27/12*   (2006.01)

(52) U.S. Cl.
  CPC ..... *G02B 13/0065* (2013.01); *G02B 13/0085* (2013.01); *G02B 17/08* (2013.01); *G02B 27/1066* (2013.01); *G02B 27/123* (2013.01); *H01L 27/14625* (2013.01); *H01L 27/14627* (2013.01); *H01L 27/14685* (2013.01); *H04N 5/2254* (2013.01)

(56) References Cited

U.S. PATENT DOCUMENTS

| | | | | |
|---|---|---|---|---|
| 7,683,310 B1* | 3/2010 | Sinclair | ................ | G01S 7/4804 250/203.1 |
| 8,629,930 B2* | 1/2014 | Brueckner | ........... | H04N 5/2254 348/335 |
| 8,988,582 B2* | 3/2015 | Findlay | ................ | G02B 3/0043 348/340 |
| 2004/0165823 A1* | 8/2004 | Morris | ................ | G02B 3/0012 385/33 |
| 2004/0252384 A1* | 12/2004 | Wallerstein | ............ | G02B 13/06 359/725 |
| 2007/0053037 A1* | 3/2007 | Kang | ................ | H01L 27/14621 359/204.1 |
| 2007/0109438 A1* | 5/2007 | Duparre | ............... | G02B 3/0012 348/335 |
| 2009/0179142 A1* | 7/2009 | Duparre | ............... | G02B 3/0031 250/208.1 |
| 2011/0013292 A1* | 1/2011 | Rossi | ................ | H01L 27/14621 359/738 |
| 2011/0026141 A1* | 2/2011 | Barrows | ........... | H04N 5/2254 359/737 |
| 2011/0032409 A1* | 2/2011 | Rossi | .................... | G02B 5/005 348/340 |
| 2011/0122308 A1 | 5/2011 | Duparre | | |
| 2011/0176022 A1* | 7/2011 | Cho | ...................... | H04N 5/374 348/222.1 |
| 2011/0228142 A1* | 9/2011 | Brueckner | ........... | H04N 5/3572 348/241 |
| 2012/0013749 A1* | 1/2012 | Oberdoerster | .... | H01L 27/14625 348/207.1 |
| 2013/0019461 A1* | 1/2013 | Rudmann | ............ | H01L 25/167 29/592.1 |
| 2015/0116527 A1* | 4/2015 | Rossi | .................... | H04N 3/1593 348/218.1 |
| 2016/0041038 A1* | 2/2016 | Geiger | .................... | G01J 5/046 250/338.1 |

* cited by examiner

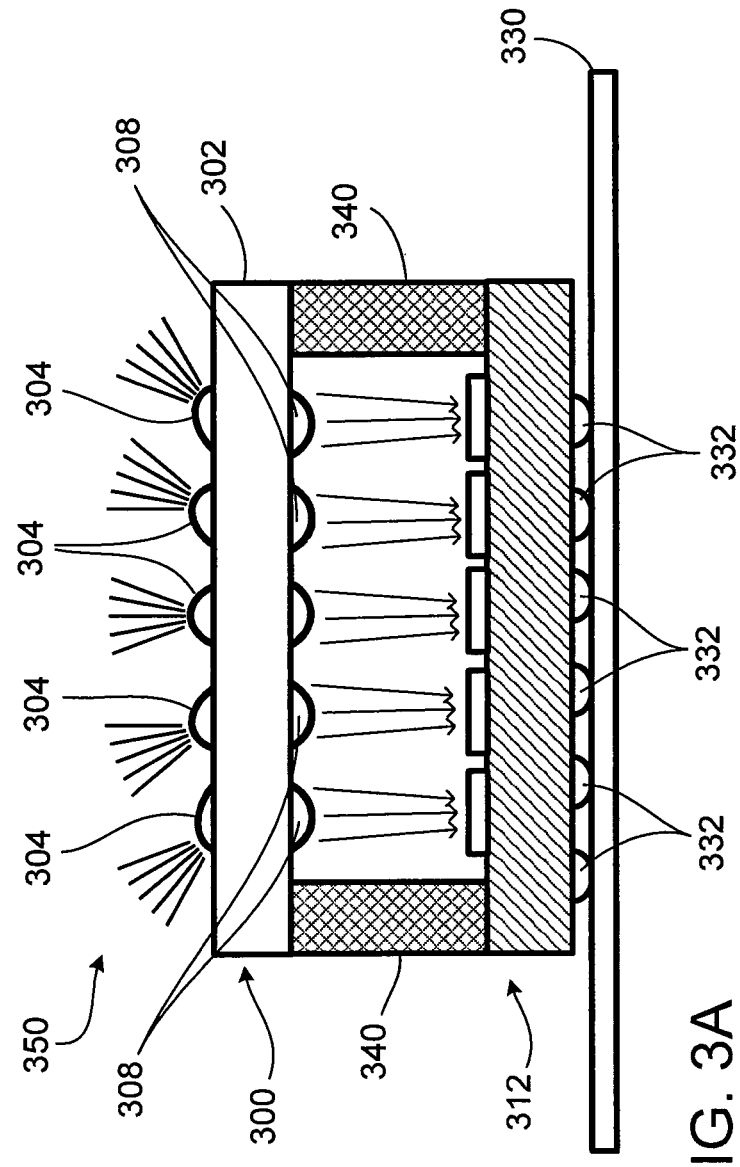

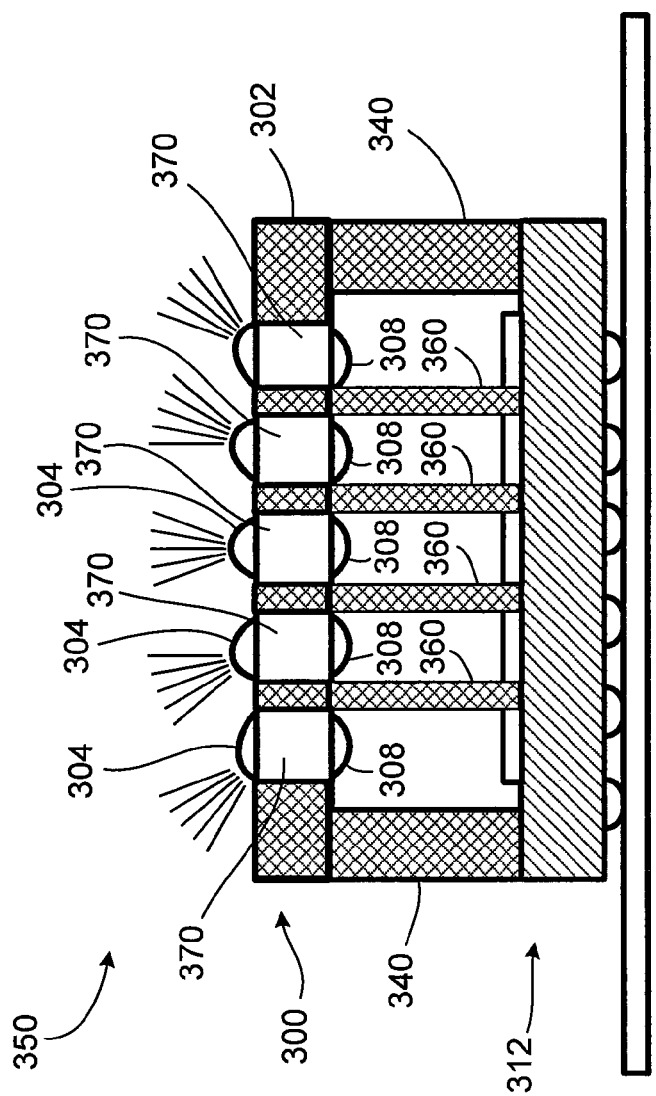

LENS ARRAY MODULES AND WAFER-LEVEL TECHNIQUES FOR FABRICATING THE SAME

FIELD OF THE DISCLOSURE

The present disclosure relates to lens array modules and wafer-level techniques for fabricating the same.

BACKGROUND

Compact digital cameras can be integrated into various types of consumer electronics and other devices such as mobile phones and laptops. In such cameras, lens arrays can be used to concentrate light, imaged on a photodetector plane by a photographic objective, into smaller areas to allow more of the incident light to fall on the photosensitive area of the photodetector array and less on the insensitive areas between the pixels. The lenses can be centered over sub-groups of photodetectors formed into a photosensitive array. For many applications, it is desirable to achieve a wide field of view as well as good depth information.

SUMMARY

In a first aspect, the subject matter of the present disclosure can be embodied in a lens module that includes a substrate, a first array of passive optical elements on the substrate, and a second array of passive optical elements separate from the first array. The optical elements of the first array and the optical elements of the second array form multiple optical channels, in which at least one optical channel is a catadioptric optical channel including a reflective optical element and a refractive optical element. The reflective optical element is arranged to reflect light toward the refractive optical element, each optical channel has a corresponding field-of-view, and the lens module has an overall field of view defined by the range of angles subtended by the field-of-view of the plurality of optical channels.

The lens module can have one or more of the following features. For example, in some implementations, the field-of-view of each optical channel is smaller than the overall field-of-view.

In some implementations, the overall field-of-view is no more than about 184 degrees.

In some instances, the field-of-view of the catadioptric optical channel is no more than about 90 degrees. The field-of-view of one or more additional optical channels in the first array can be no more than about 60 degrees.

In certain implementations, the reflective optical element is a passive optical element from the first array, and the refractive optical element is a passive optical element from the second array.

In some cases, each passive optical element in the first array is configured to redirect incident light through the substrate to a second side of the substrate opposite the first side.

In some implementations, the second array of passive optical elements is arranged on the second side of the substrate, and each passive optical element in the first array of lenses is configured to redirect incident light to a corresponding passive optical element of the second array. The substrate can include multiple regions transmissive to light, in which each region is aligned between a first optical element and a second optical element of a corresponding optical channel. At least one transmissive region can include a filter that allows a specified wavelength or range of wavelengths to pass through. The filter can allow transmission of wavelengths corresponding to infrared light, blue light, red light, or green light. The substrate can include multiple blocking portions separating the transmissive regions from one another, in which the blocking portions are substantially non-transparent to the wavelengths of the incident light.

In some implementations, at least a portion of the reflective optical element includes a reflective thin film. The reflective thin film can include a metal thin film. The reflective thin film can include a dielectric stack.

In some instances, a shape of the reflective optical element is partially aspherical, partially spherical or partially cylindrical. The reflective optical element can have a radius of curvature of at least about 0.5 mm.

In some implementations, a diameter of the reflective optical element is greater than about 250 microns and less than about 7.5 mm. The diameter of the reflective optical element can be greater than about 500 microns and less than about 5 mm.

In certain implementations, the reflective optical element is configured to redirect light to the refractive optical element by total internal reflection.

In some instances, the reflective optical element is a prism.

In another aspect, the subject matter of this disclosure can be embodied in an array camera module that includes a base layer including an array of light-detecting elements on a surface of the base layer, where each light-detecting element is configured to detect a specified wavelength or range of wavelengths, and a lens module including a substrate, a first array of passive optical elements arranged on a first side of the substrate, and a second array of passive optical elements separate from the first array, where the optical elements of the first array and the optical elements of the second array forming multiple optical channels, each optical channel having a corresponding field-of-view. At least one optical channel is a catadioptric optical channel including a reflective optical element and a refractive optical element, the reflective optical element being arranged to reflect light toward the refractive optical element. The lens module has an overall field of view defined by the range of angles subtended by the field-of-view of each lens of the plurality of optical channels. The array camera also includes a spacer separating the base layer from the lens module, where the spacer serves as a wall that surrounds the light-detecting elements.

The array camera module can include one or more of the following features. For example, in some implementations, the reflective optical element includes a reflective thin film for reflecting the specified wavelength or range of wavelengths. The reflective thin film can include a metal thin film or a dielectric thin film stack.

In some instances, the reflective optical element is configured to redirect light having the specified wavelength or range of wavelengths to the refractive optical element by total internal reflection.

In certain implementations, the field-of-view of each optical channel in the first array is smaller than the overall field-of-view.

In some implementations, the overall field-of-view is no more than about 184 degrees.

In some cases, the field-of-view of the at least one catadioptric optical channels is no more than about 90 degrees. For example, the field-of-view of one or more additional optical channels in the first array can be no more than 60 degrees.

In certain instances, the reflective optical element is a passive optical element from the first array, in which the refractive optical element is a passive optical element from the second array.

In some implementations, each optical channel is configured to redirect incident light having the specified wavelength or range of wavelengths to a corresponding light-detecting element on the base layer.

In some implementations, the second array of passive optical elements is arranged on a second side of the substrate opposite the first side of the substrate.

In some implementations, the spacer defines a transparent region between the lens module and the base layer through which light redirected from the lens module passes to the base layer. The spacer can serve as a sidewall of the module that is substantially non-transparent to a specific wavelength or range of wavelengths.

In some implementations, the base layer includes a printed circuit board (PCB) and the array of light-detecting elements is electrically connected to a conductive pattern in the PCB.

In certain instances, the array camera module includes a channel flange focal length (FFL) correction layer between the lens module and the base layer, in which the optical axes of the optical channels intersecting the channel FFL layer, and in which respective portions of the channel FFL correction layer intersected by the optical axes have different thicknesses from one another.

In some implementations, the reflective optical element is a lens.

In certain implementations, the reflective optical element is a prism.

In another aspect, the subject matter of the present disclosure can be embodied in methods for fabricating a lens module, in which the methods include providing a substrate, arranging a first multiple of passive optical elements on a first side of the substrate into a first array, and arranging a second multiple of passive optical elements into a second array, such that multiple optical channels are formed, each optical channel including a passive optical element from the first array and a passive optical element from the second array. At least one optical channel is a catadioptric optical channel including a reflective optical element and a refractive optical element, each optical channel has a corresponding field-of-view, and the multiple optical channels define an overall field-of-view for the lens module.

The methods may have one or more of the following features. For example, in some implementations, arranging the first multiple of passive optical elements includes forming the first multiple of passive optical elements on the substrate by a replication technique.

In some implementations, arranging the first multiple of passive optical elements includes forming the first plurality of passive optical elements by an injection molding or glass molding technique.

In certain implementations, arranging the first multiple of passive optical elements includes: forming multiple lenses, and placing the lenses on the first side of the substrate using a pick-and-place technique. The method can further include depositing a reflective coating on a portion of at least one of the passive optical elements of the first array. Depositing the reflective coating can occur after arranging the first multiple of passive optical elements on the first side of the substrate.

Depositing the reflective coating can occur before arranging the first multiple of passive optical elements on the first side of the substrate.

In some implementations, the substrate includes multiple transmissive portions transparent to a specified wavelength or range of wavelengths. Arranging the first multiple of passive optical elements can include arranging each passive optical element of the first array over a corresponding transmissive portion of the substrate.

In some implementations, the second multiple of passive optical elements are arranged on a second side of the substrate opposite to the first side of the substrate. Arranging the second multiple of passive optical elements can include forming the second multiple of passive optical elements on the second side of the substrate by a replication technique. Arranging the second multiple of passive optical elements includes forming the second multiple of passive optical elements on the second side of the substrate by an injection molding or glass molding technique. Arranging the second multiple of passive optical elements can include forming the second multiple of passive optical elements on the second side of the substrate by a pick-and-place technique. Arranging the second multiple of passive optical elements can include aligning one or more of the second multiple of passive optical elements with one or more corresponding passive optical elements of the first array to form at least one optical channel.

In another aspect, the subject matter of the present disclosure can be embodied in methods of manufacturing an array camera module, in which the methods include providing a base wafer on which are mounted multiple light-detecting elements, and providing a lens wafer over the base wafer to form a wafer stack, where the lens wafer includes a substrate and multiple optical channels. Each optical channel includes a first passive optical element and a second passive optical element, where the first passive optical element is arranged to redirect light to the second passive optical element, and where at least one optical channel is a catadioptric optical channel including a reflective optical element and a refractive optical element. The methods further include providing a spacer between the base wafer and the lens wafer, in which the spacer serves as a wall that surrounds the light-detecting elements, and dividing the wafer stack into individual array camera modules, in which each array camera module includes two or more light-detecting elements and a lens array.

The methods may include one or more of the following features. For example, in some implementations, the methods can further include manufacturing at least a portion of the lens wafer by a replication technique.

In some implementations, the methods include manufacturing at least a portion of the lens wafer by an injection molding or glass molding technique.

In some cases, the methods further include manufacturing at least a portion of the lens wafer by a pick-and-place technique.

In some implementations, the methods further include providing a channel flange focal length (FFL) correction layer between the base wafer and the lens wafer.

In certain implementations, the methods further include providing one or more optical filter layers on the base wafer, in which the one or more optical filters covering corresponding light-detecting elements, and in which the one or more optical filters are configured to block transmission of light having a specified wavelength or range of wavelengths. Any of the foregoing implementations can include dividing the wafer stack, including dicing through the spacer.

In another aspect, the subject matter of the present disclosure can include an electronic device including a camera system, in which the camera system includes any of the foregoing array camera modules.

The details of one or more embodiments are set forth in the accompanying drawings and the description below. Other features and advantages will be apparent from the description, the drawings, and the claims.

BRIEF DESCRIPTION OF THE DRAWINGS

FIGS. 3A and 3B are schematics illustrating side-views of an array camera module.

DETAILED DESCRIPTION

Figure 1A:
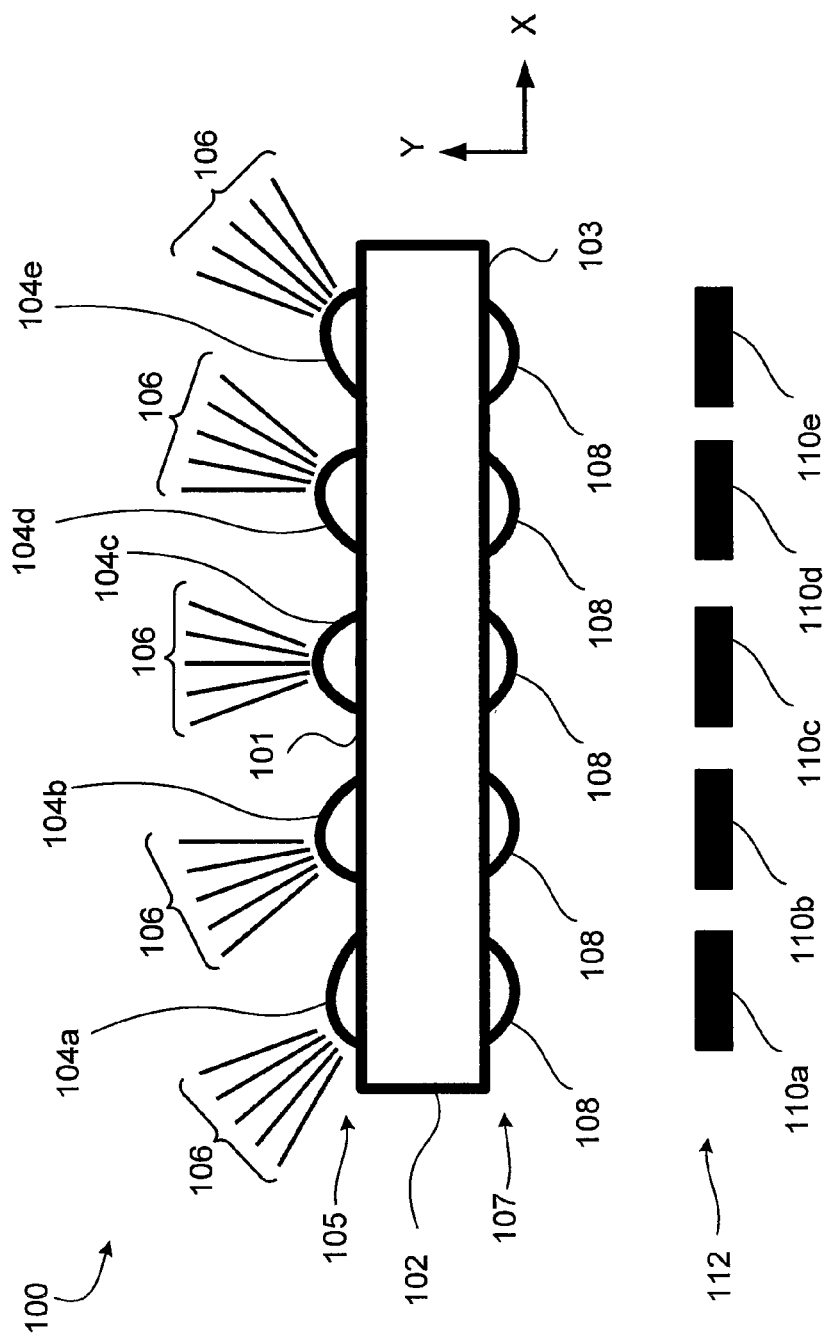
FIG. 1 is a schematic illustrating a side-view of a lens module.

As shown in FIG. 1A, a lens module 100 includes a substrate 102 and a first array 105 of passive optical elements 104 (e.g., lenses) arranged on a first side 101 of the substrate 102. The lens module 100 may be incorporated as part of an array camera module for use in an electronic device, such as a phone, laptop computer, personal digital assistant or tablet device. The lens array 105 can be formed, for example, as an array of achromatized refractive/diffractive lenses or refractive microlenses. Each lens 104 in the first array 105 is configured to receive incident light of a specified wavelength or range of wavelengths and redirect the incident light to a different direction. Preferably, the light is redirected toward the substrate 102, which contains one or more regions that are transparent to the specified wavelength or range of wavelengths. The light redirected by the lens array 105 passes through the substrate 102 and emerges from a second side 103, where some or all of the light subsequently proceeds to an image-sensor array 112 containing light-detecting elements 110. In some implementations, each lens 104 is arranged such that it redirects incident light to a corresponding light-detecting element 110 situated beneath the lens array 105. An output image then may be constructed, for example, by photo stitching together the images obtained from each individual detecting element (e.g., by using image processing to combine the different detected images).

The schematics shown in FIG. 1A and in the other figures of the present disclosure depict approximations of the structure and function of device components and are not drawn to scale. Though only five lenses are shown in the present example, any number of optical elements may be included in the array. The lens array can have various shapes, as well. For example, the lens array can be formed as a circular array of optical elements, with the optical elements arranged in one or more concentric rings. Alternatively, the optical elements can be arranged in a square array having multiple rows and columns of lenses or a single row or single column of lenses. The lenses of the array 105 can have an approximately circular base, in which the diameter is between about 250 microns and about 7.5 mm, for example, between about 500 microns and 5 mm. The lens thicknesses can range from, for example, about 500 microns to about 5 mm. The passive optical elements of the array can include convex lenses, concave lenses, or other optical elements for conditioning and/or redirecting light. With respect to the examples shown and disclosed, the passive optical elements may be referred to as lenses with the understanding that the passive optical elements are not limited to lenses.

In addition to the array of passive optical elements positioned on the side of the substrate that is exposed to incident light from the object being imaged, the lens module 100 can include a second array 107 of passive optical elements (e.g., lenses) 108 on the sensor-side 103 of the substrate 102. Each optical element 108 in the second array may be substantially aligned with a corresponding optical element 104 in the first array 105 so as to form a vertical lens stack or "optical channel." As a result, each channel has a beam optical axis formed by the coinciding principal axes of the optical elements included in the channel. In the present example, the combination of each pair of lenses from the first side and the sensor-side focuses the incoming light signal on the corresponding light-detector element(s) 110 in the image sensor 112.

Figure 1B:
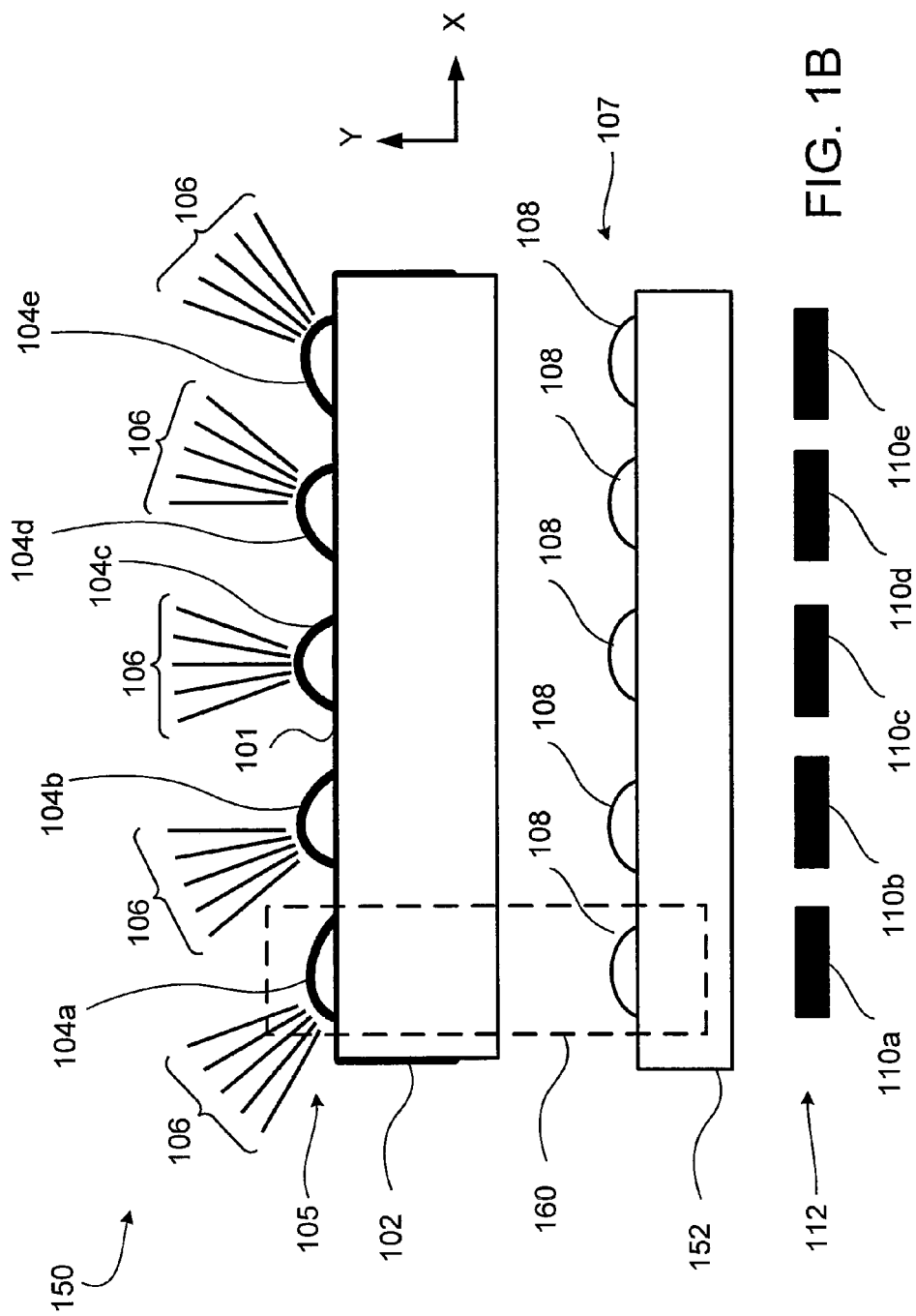

Though the optical channels of the lens module 100 include a passive optical element on the first side 101 of the substrate 102 and another passive optical element on the sensor-side 103, other arrangements are also possible. For example, the second array of optical elements may be formed on a separate substrate from substrate 102. One or more channels may include more than two optical elements. In some implementations, the optical elements are each arranged using a single substrate or using multiple separate substrates. As an example, FIG. 1B is a schematic illustrating a cross-section of a lens module 150 that is similar to the lens module 100, except that the module 150 includes a second substrate 152 on which the second array 107 of passive optical elements (e.g., lenses) is formed. At least one optical element from the first array 105 is aligned with another optical element from the second array 107 to form an optical channel 160 (indicated by region contained within dashed lines) through which light incident on the optical element of the first array is redirected to a corresponding light-detecting element 110 in the image-sensor 112.

The range of angles of incident light subtended by each optical element 104, and thus by the channel, of the lens module 100 in the plane of FIG. 1 (i.e., the x-y plane) represents the optical element's (and channel's) "angular field-of-view," or simply "field-of-view" (FOV) 106 for short. In some implementations, the FOV is understood as the area that is imaged by the optical channel onto a corresponding light-detecting element. Though referenced in the following examples in terms of angles, the FOV may also be expressed as a linear FOV defined in terms of a ratio of the length of the visible region to the distance between the optical channel and the location of the region observed. The optical channels in the lens module 100 may have a different field-of-view from one another. For example, in some implementations, a first optical channel has a FOV that is 20 degrees, a second optical channel may have a FOV that is 30 degrees, while a third optical channel may have a FOV that is 45 degrees. Other fields-of-view may also be possible. Though the FOV of each optical channel is shown just for the x-y plane in FIG. 1A, the FOV may be the symmetric around the central optical axis of the lens.

Preferably, the FOV of each lens 104 is centered around the lens' optical axis. Furthermore, the FOV 106 of each lens 104 in the array 105 may cover different regions of space. To determine the FOV of a particular lens or optical channel, one looks at the angles subtended by the lens as measured from a fixed reference plane (such as the surface of the substrate 102, a plane that extends parallel with the substrate surface such as a plane extending along the horizontal x-axis in FIG. 1, or the image plane of image-sensor array 112). Alternatively, one can define the FOV with respect to a central optical axis of the lens or optical channel.

For example, suppose the FOV of each lens 104 in FIG. 1 covers a range of angles of about 30 degrees. The lens 104a on the left-most side of the array 105 shown in FIG. 1 may be configured to have a FOV corresponding to the angles between 0 and 30 degrees, as measured from the reference plane (e.g., a FOV of +/−15 degrees centered around an optical axis of 15 degrees as measured from the reference plane). Lens 104b, however, may be configured to have a FOV corresponding to the angles between 30 and 60 degrees, as measured from the reference plane (e.g., a FOV of +/−15 degrees centered around an optical axis of 45 degrees as measured from the reference plane). Similarly, lenses 104c, 104d, and 104e may be configured to have a FOV corresponding to the angles between 60 and 90 degrees (e.g., a FOV of +/−15 degrees centered around an optical axis of 75 degrees as measured from the reference plane), a FOV corresponding to the angles between 90 and 120 degrees (e.g., a FOV of +/−15 degrees centered around an optical axis of 105 degrees as measured from the reference plane), and a FOV corresponding to the angles between 120 and 150 degrees (e.g., a FOV of +/−15 degrees centered around an optical axis of 135 degrees as measured from the reference plane), respectively.

The total range of angles subtended by all of the lenses 104 (or channels) in the array 105 and detected by the sensor array 112 defines the array's "overall field-of-view." For example, although each lens in the array 105 may have a relatively small FOV (e.g., an FOV in the range of 20° to 60°), the combination of the lenses in the array 105 effectively expands the array's overall FOV compared to the FOV of any individual lens. To enable the lens module to have an overall field-of-view different from the field-of-view of each individual lens, the central optical axes of the lenses can be varied. For example, the optical axis of a particular lens in a lens array can be located at a distance which becomes progressively larger than the center-to-center distance of the sub-groups of light-detecting elements in the image-sensor array. The displacement of the optical axes increases radially from the center of the lens array. Decentering a lens' optical axis tends to bend rays from off-axis field angles into the center of the lens' field of view. By moving the optical axis of the lens further out radially with increasing distance from the center of the lens array, the angular location of an object at the center of the field of view for a given lens/sub-group of light-detecting elements originates from increasingly off-axis segments of the total field of view.

Alternatively, a particular lens' central optical axis may be inclined at a different angle relative to an optical axis of a neighboring lens. That is, the angle of the central optical axis for the lens, as measured from a reference plane (or a plane parallel to the reference plane), may differ from the optical axis angle of a different lens in the array. For example, in the implementation shown in FIG. 1, the optical axis of lens 104c is generally perpendicular (approximately 90°) with respect to the surface 101 of the substrate 102 and/or the image plane of the sensor array 112. In contrast, the lenses 104a, 104b, 104d, and 104e are configured such that their respective optical axes (not shown) are tilted (i.e., non-perpendicular) with respect to the surface 101 of the substrate 102 and/or the image plane of the sensor array 112.

Thus, for a five lens array as shown in FIG. 1, in which each lens 104 has an individual FOV 106 covering a different region of space over a span of 15 degrees, the overall FOV for the lens module is 75 degrees. It is important to note, however, that if two or more lenses (or channels) have fields-of-view that overlap or cover the same regions of space, the overall FOV is defined by the entire range of angles subtended by all of the lenses (or channels) in the array, and is not the value obtained by adding the individual fields-of-view of each lens.

Preferably, the lenses 104 cover different regions of space, so that the overall FOV is greater than any individual FOV. In some implementations, the lenses 104 (or channels) have fields-of-view that cover overlapping regions. As an example, a first lens 104a may cover the region subtended between 15 and 30 degrees from the reference plane, whereas a second lens 104b may cover the region subtended between 25 and 40 degrees from the reference plane, a third lens 104c may cover the region between 35 and 50 degrees from the reference plane, a fourth lens 104d may cover between 45 and 60 degrees from the reference plane, and a fifth lens 104e may cover between 55 and 70 degrees from the reference plane.

In certain implementations, it may be difficult to image light arriving at shallow angles relative to the reference plane (i.e., high angles of incidence with respect to the optical axis). That is, the passive optical elements in one or more optical channels may be unable to refract the shallow incident light sufficiently so that the light passes through the transparent portion(s) of the substrate and/or so that the light can be redirected to a corresponding light-detecting element of the sensor array. For example, light arriving at lens 104a at angles between 0 and 15 degrees from the reference plane may be too shallow to be refracted to a corresponding light-detecting element 110a arranged beneath lens 104a. As a result, the FOV 106 for such lenses is limited to a relatively short range of angles (e.g., between about 82 degrees to about 97 degrees with respect to the reference plane) that will actually be refracted to the desired pathway. For example, the range of angles covered in the FOV for refractive lenses in a micro-optical lens array as shown in the arrangement of FIG. 1 is typically not more than 20 degrees (e.g., +/−10 degrees centered around the lens' optical axis). Furthermore, the smallest angle relative to the substrate surface that can be included in the lens FOV is about 40 degrees (i.e., a maximum of about 50 degrees from an optical axis oriented perpendicular to the substrate surface).

To address the difficulty of imaging light incident at shallow angles relative to the reference plane (or a plane parallel to the reference plane), one or more of the optical channels in the lens module may be configured to include both a refractive optical element and a reflective optical element so as to form a catadioptric optical system. A catadioptric optical system is where refraction and reflection are combined in a single optical system to achieve a desired redirection of incident light. By combining the processes of reflection and refraction, a catadioptric optical system is capable of increasing the FOV relative to an optical channel that is limited to redirecting light toward the desired direction or light-detecting element based on refraction.

Figure 2A:
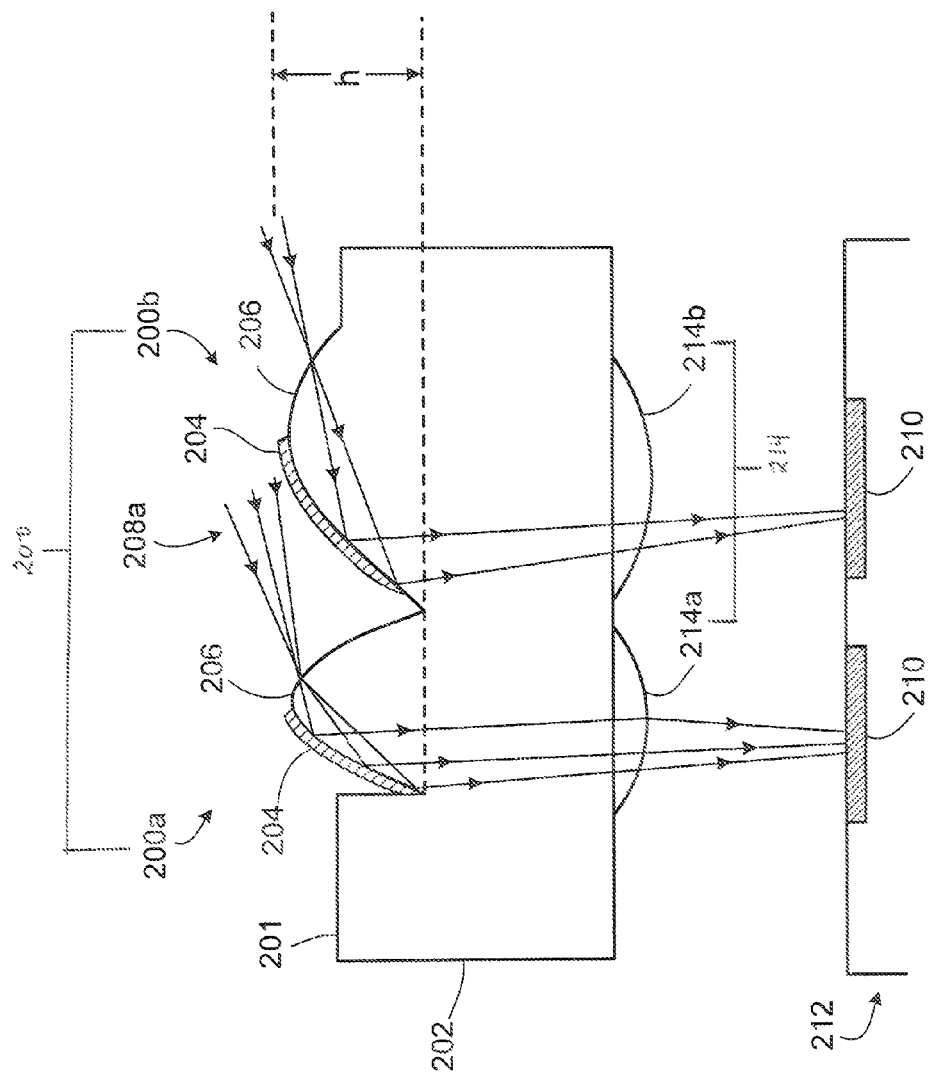
FIG. 2 is a schematic illustrating a cross-section of a catadioptric lens.

FIG. 2A is a schematic cross-section of two examples of catadioptric optical channels. A first optical channel includes a reflective optical element 200a from a first array 200 on a top surface of the substrate 202 and a refractive optical element 214a from a second array 214 on a bottom surface of the substrate 202, whereas a second optical channel includes a reflective optical element 200b from the first array 200 and a refractive optical element 214b from the second array 214. The schematic of FIG. 2A depicts an approximation of the structure and function of a catadioptric optical channels and is not drawn to scale. Though only two optical channels are shown, any number of optical channels may be included in the array.

Each of reflective optical elements 200a, 200b includes two portions: a first portion 204 that is reflective to light having the specified wavelength or range of wavelengths and a second portion 206 that is transmissive to the specified wavelength or range of wavelengths. The interface between the second portion 206 and the external environment (e.g., air) refracts at least a portion of incident light toward the first portion 204. Upon reaching the first portion 204, the light is reflected by the first portion 204 through the desired transmissive portion(s) of the substrate 202 toward the corresponding refractive optical element 214a or 214b. The combination of the reflective optical element and refractive optical element in each optical channel can be used to focus the incoming light signal onto the corresponding light-detector element(s) 210 in the image sensor 212.

For example, as shown in FIG. 2A, a first group 208a of light rays having a specified wavelength or range of wavelengths is incident on the lens 200a of a first catadioptric channel. Specifically, the rays are incident on the second portion 206 of the lens 200a, where the rays are refracted. In the absence of the reflective portion 204, the rays would then pass through lens 200a or scatter or be absorbed (e.g., by a portion of the substrate 202 that is not transparent to the specified wavelength or range of wavelengths) without being redirected along a path that ultimately reaches a light-detecting element of an image-sensor array 212. With the reflective portion 204 in place, however, the incident rays are subsequently reflected along an optical path towards the refractive optical element 214a and a corresponding light-detecting element 210. By making use of the reflective optical element, the range of angles that can be deflected by the optical channel toward a desired pathway can be increased. For example, certain catadioptric optical channels may be used to redirect light that is incident between 0 and 40 degrees relative to the reference plane (i.e., up to 90 degrees with respect to an optical axis oriented perpendicular to the substrate surface).

Referring again to FIG. 1, the lens module 100 can be composed of all catadioptric optical channels or a combination of catadioptric optical channels and optical channels including refractive-only optical elements. For example, in some implementations, catadioptric optical channels are used in place of refractive-only optical channels near the outer edges of the lens module 100/substrate 102. By placing the catadioptric optical channels near the outer edges of the array, they are better positioned to receive and redirect incident light beams that are at shallow angles with respect to the reference plane (i.e., at high angles relative to a lens optical axes oriented substantially perpendicular to the substrate surface), thus increasing the range of angles within the overall FOV of the module 100. Optical channels closer to the center of the array, in contrast, would include refractive only lenses that are better suited for capturing light incident at angles that are high relative to the reference plane (i.e., shallow with respect to a lens' optical axis oriented substantially perpendicular to the substrate surface).

For example, one or more optical channels in and/or near the center of the array 105 can be configured to have a FOV that covers the angles between 80 and 100 degrees with respect to the reference plane (between +/−10 degrees with respect to an optical axis oriented perpendicular to the substrate surface). In addition, one or more catadioptric optical channels may be arranged near the outer edges of the array 105, in which the catadioptric optical channels have a FOV that covers the angles between 0 and 40 degrees or between 140 and 180 degrees with respect to the reference plane (between 50 and 90 degrees as measured with respect to an optical axis oriented perpendicular to the substrate surface). Additional optical channels (catadioptric and/or refractive-only) in the array can be used to cover a range of angles between the FOV of the catadioptric optical channels near the array edge and the FOV of the center optical channels. Thus, by including one or more catadioptric optical channels in a lens array, the array's overall FOV can be increased without requiring a complex arrangement of optical components. For example, the catadioptric optical channels can be used to increase the overall FOV up to about 184 degrees, within applicable tolerances for component assembly and image processing. Furthermore, the use of catadioptric optical channels minimizes the number of optical elements required in the channel to increase the FOV, and thus assists in keeping the height of the lens module (i.e., measured along the y-axis) low, which can be advantageous for mobile electronic devices where compactness and minimal use of space is important.

Referring again to FIG. 2A, the reflective portions 204 only partially form an outer surface of the lenses 200a, 200b. The area over which the reflective portion 204 covers may be varied depending on the desired angles of incident light one intends to redirect. For example, the reflective portion 204 may cover up to approximately 10% of the outer surface, up to approximately 20% of the outer surface, up to approximately 30% of the outer surface, up to approximately 40% of the outer surface, or up to approximately 50% of the outer surface. Other coverage areas are also possible.

The portions 206 of the optical elements configured to refract incident light can be composed, for example, of a plastic or glass material and can be formed on the substrate 202 using techniques such as replication, casting, compression molding, micro-machining, polishing, or injection molding. Other materials that are compatible with those fabrication techniques also may be used. For manufacturing, the materials preferably have good dimensional stability from which accurate shapes can be formed.

Once the portions 206 configured to refract incident light are formed, the reflective portion 204 may be formed on a surface of the portion 206. For example, the reflective portion may be formed using thin-film deposition techniques such as electron beam deposition, thermal evaporation, or sputtering, among others. The material of the reflective portion 204 can include any material suitable for reflecting a specified wavelength or range of wavelengths. For example, the material for the reflective portion 204 can include thin film metals such as silver, gold, or aluminum. In some implementations, the material forming the reflective portion 204 can include a stack containing alternating layers of high and low refractive index material, such as a dielectric mirror (Bragg mirror). For example, the reflective portion 204 can be composed of thin films of high refractive index materials such as zinc sulfide (n=2.32) or titanium dioxide (n=2.4) alternating with thin films of low index material such as magnesium fluoride (n=1.38) or silicon dioxide (n=1.49). Other high and low refractive index materials can be used as well. Using such structures, the catadioptric optical channels can be designed to redirect only certain wavelengths or ranges of wavelengths. In some implementations, the first portion 204 and the second portion 206 of the reflective optical elements are formed separately from the substrate, and then are positioned on the substrate 202 using pick-and-place techniques.

Figure 2B:
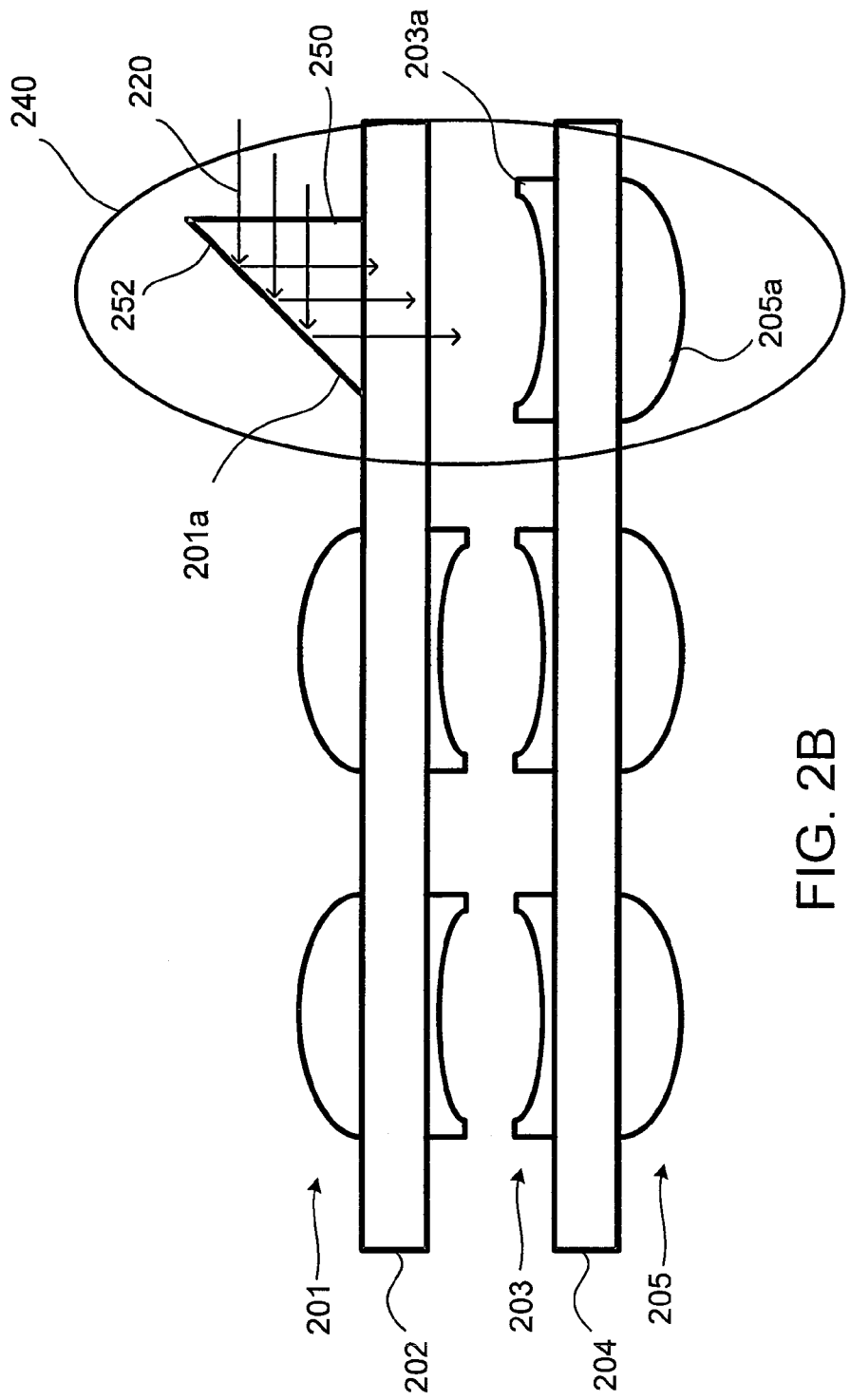

The reflective optical elements of the catadioptric optical channels do not have to be implemented using a separate reflective material such as a metal or dielectric stack. Instead, the desired reflectivity may be achieved using total internal reflection. For example, FIG. 2B is a schematic illustrating a cross-section of a catadioptric channel, the elements of which are encircled by ellipse 240. The catadioptric channel 240 includes a reflective element 201a from a first optical element array 201 on a first substrate 202 and two separate refractive optical elements 203a, 205a from second and third optical element arrays 203, 205 arranged on a separate substrate 204. The reflective optical element 201a in the present example is a right-angle triangular prism. The element 201a has a refractive index $n_p$, and the environment around the element 201a, excluding the substrate 202, has a refractive index $n_a$ that is less than $n_p$. The element 201a can be configured to have about the same size as the other optical elements in the array 201. Light 220 incident on a first interface 250 of the element 201a may, depending on the angle of incidence, be refracted toward a second interface 252. Assuming the refracted light strikes the interface 252 at an angle larger than the critical angle (which can be expressed as $\arcsin(n_a/n_p)$), the light is totally internally reflected away from the interface 252. For ease of viewing, subsequent refraction of the light at the prism-substrate interface and the substrate-air interface is not shown. The totally internally reflected light then proceeds to the other optical elements of the channel 240. The prism 201a therefore allows redirection of light having incident angles that could not be captured using an optical channel relying on refractive effects alone. As explained above, such catadioptric channels can thus be combined with other refractive-only optical channels to increase the overall field-of-view of a lens array in a camera module.

Figure 2C:
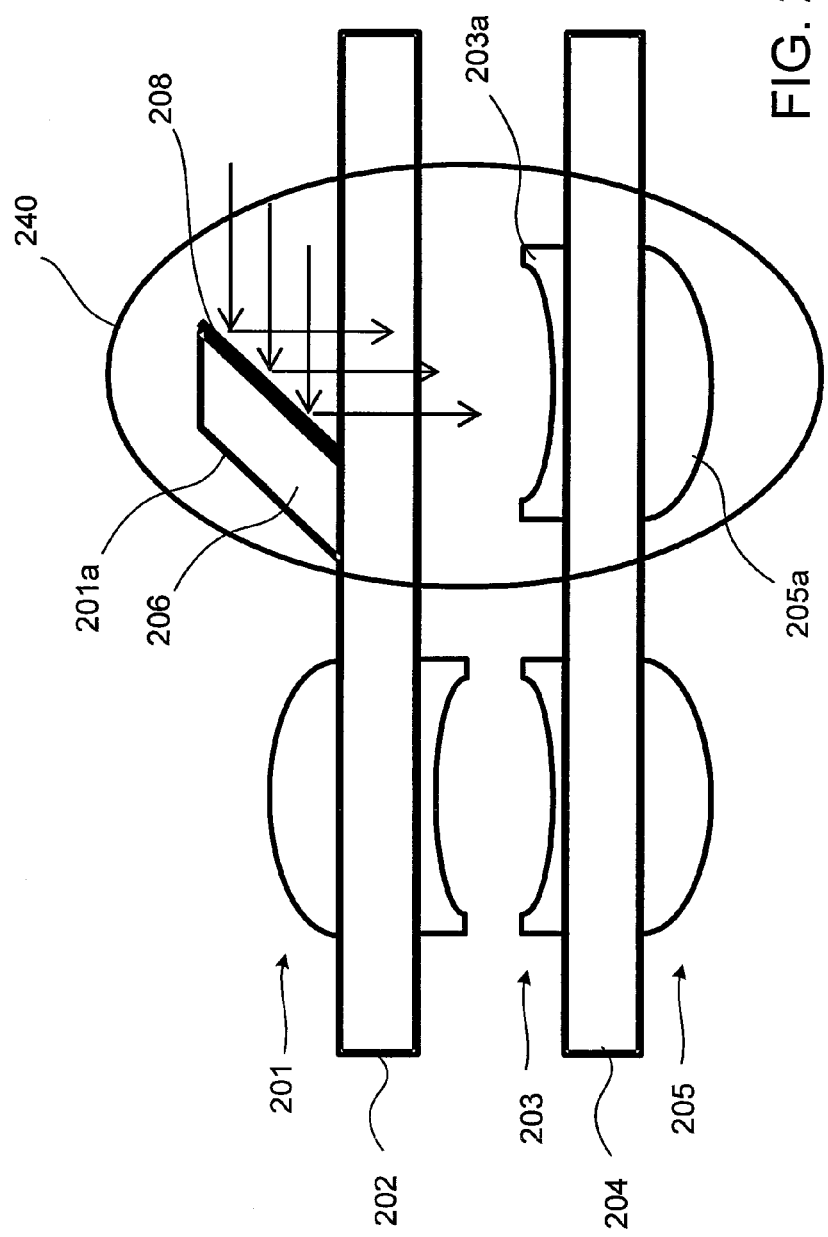

Although a right-angle triangular prism is shown in FIG. 2B, other shapes and optical elements can also be used. For example, FIG. 2C is a schematic illustrating a cross-section of a catadioptric channel, identified by ellipse 240. The channel 240 includes a reflective optical element 201a of a first optical element array 201 arranged on substrate 202 and two additional refractive optical elements 203a, 205a of arrays 203, 205, respectively, arranged on a second substrate 204. The reflective optical element 201a includes a prism or parallelepiped-like body 206 having a surface on which a reflective coating 208 is formed. Depending on how the body 206 is angled, light 220 incident on the reflective coating 208 is reflected toward the refractive optical elements 203a, 205a of the channel.

For the implementations shown in FIGS. 2A-2C, as well as other implementations, the optical elements can be fabricated using techniques such as replication, casting, compression molding, micro-machining, polishing, or injection molding. In some-implementations, the optical elements may be positioned on the substrates using pick-and-place techniques. The optical elements may be formed from materials, such as optical grade glass, suitable for transmitting a desired wavelength or range of wavelengths of light. As before, the reflective material may include, for example, a thin film metal such as gold, silver, or aluminum, among others.

As shown in FIGS. 2A-2C, the reflective optical elements can have different shapes. In some implementations, the surfaces of the reflective optical elements in the catadioptric channel correspond to, for example, portions of a sphere or a cylinder, or can be aspherical. For example, referring again to FIG. 2A, the surface of lens 200a corresponds to a portion of an aspheric object having a narrow base along the X-direction relative to the lens height along the Y-direction, and thus larger curvature. The lens 200b also has a surface corresponding to a portion of an aspheric object but has a base along the X-direction that is wide relative the lens height along the Y-direction, and thus smaller curvature. The lens with the larger curvature therefore may be able to redirect incident light over a greater range of angles compared to the lens with smaller curvature. The radius of curvature of the lenses can range from being very small on the order of, for example, 1 mm (i.e., a short focal length) to infinity (i.e., flat mirror). Example ranges for the radius of curvature of the lenses are between about 2 and about 10 mm, between about 3 and about 9 mm, or between about 4 and about 8 mm. The thicknesses of the lenses also can be varied. As shown in FIG. 2, the thickness h of the lenses is determined as the distance from the lens peak to the base of the lens. The lens thicknesses can range from, for example, about 0.5 mm to about 5 mm.

The substrates on which the optical elements are placed or formed can be composed, for example, entirely of a transparent material (e.g., a glass, sapphire or polymer material). Alternatively, the substrate can be composed of transparent regions (see, e.g., regions 360 in FIG. 3B) separated by regions of non-transparent material. For example, referring to FIG. 1, the transparent regions can extend through the thickness of the substrate 102 and respectively correspond to the central optical axes of the lenses 104. In the case a separate lens array 107 is used, the transparent regions can also be aligned with the central optical axes of the lenses 108. In some implementations, color filters can be embedded within or provided on the transmissive portions of the substrate 102 so that different optical channels are associated with different colors (e.g., red (between about 620 nm to about 780 nm), green (between about 495 nm to about 570 nm) or blue (between about 380 nm to about 495 nm)) and/or so that certain regions of the electromagnetic spectrum are blocked (e.g., infrared wavelengths between about 780 nm and 1000 microns or ultraviolet wavelengths between about 390 nm and about 10 nm). Other wavelength ranges for the filters may also be selected.

The image-sensor array 112 can be implemented, for example, as a photodiode, CCD or CMOS array that has sub-groups of photodetectors corresponding to the number of lenses 104, 108 forming the arrays 105, 107. In some implementations, some of the photodetector elements in each sub-group are provided with a filter (e.g., monochromatic red, green or blue, infrared (IR) pass, Bayer, or neutral density filters). In some implementations, the area of each lens array (e.g., 105 and 107) is greater than the area of the image-sensor array 112. For example, though FIG. 1 depicts each lens 104 in lens array 105 being aligned directly over a corresponding light-detecting element 110, the lenses may be laterally offset from the corresponding detecting element to which the lens redirects incident light.

The lens module 100 can be made relatively small. For example, in some implementations, the module 100 has dimensions on the order of about 15 mm or less (width)×15 mm or less (length)×3 mm or less (height). For example, in a particular implementation, module 100 has dimensions on the order of about 5 mm (width) 5 mm (length)×2 mm (height). Different dimensions may be appropriate for other implementations.

FIG. 3A is a schematic that shows a side view of an array-camera module 350 that is composed of a lens module 300, such as the lens module 100 of FIG. 1, and an image-sensor array 312. The lens module 300 may include one or more catadioptric channels having one or more refractive optical elements and one or more catadioptric elements. The lens substrate 302 of the lens module 300 can be separated from the image-sensor array 312, for example, by non-transparent spacers 340 that also serves as sidewalls for the array-camera module 350. In some implementations, non-transparent spacers may be used within the array-camera module 350 to separate adjacent optical channels from one another, in which the optical channel is defined as the optical pathway followed by incident light through a lens or lens-pair (e.g., lens 304 and lens 308) of the lens module 300 and to a corresponding light-detecting element of the image-sensor array 312. For example, FIG. 3B is a schematic of a camera-array module 350 that includes additional spacers 360 between light-detecting elements of the image-sensor array 312 and between optical channels 370 formed in substrate 302. The spacers in any of the foregoing implementations can be composed, for example, of a polymer material (e.g., epoxy, acrylate, polyurethane, or silicone) containing a non-transparent filler (e.g., a pigment, inorganic filler, or dye). In some implementations, the spacers are provided as a single spacer wafer with openings for the optical channels. In other implementations, the spacers can be formed, for example, by a replication or vacuum injection technique in which the spacers are formed directly on a substrate. Some implementations include a non-transparent baffle on a first side and/or a second side of the lens module 300 so as to surround the individual lenses 304 and/or 308 and prevent or limit stray light from entering the camera and being detected by the image-sensor array 312. The baffle can also be provided as a separate spacer or by vacuum injection technique.

The array-camera module 350 can be mounted, for example, to a printed circuit board (PCB) substrate 330. Electrical pads 332 on the underside of the array-camera module 350 may provide electrical connections to the PCB substrate 330. The electrical pads 332 may be contacts such as solder balls. The image-sensor array 312 may be implemented as part of an integrated circuit (IC) formed as, for example, a semiconductor chip device and which includes circuitry that performs processing (e.g., analog-to-digital processing) of signals produced by the light-detecting elements. The light-detecting elements may be electrically coupled to the circuitry through electrical wires (not shown). Additionally, signals from the light-detecting elements and/or circuitry may be electrically coupled to the pads 332 through vias (not shown) formed in the semiconductor chip. In some implementations, the circuitry for performing the processing of signals may be formed on the PCB substrate 330, in which the signals are sent from the IC to the PCB through the electrical connections 332. The PCB substrate 330 may be a constituent of an electronic device (e.g., a hand-held communication device such as a phone), a headset, a media tablet, eyewear, a watch, an electronic product for a gaming application, a camera, or a television.

Multiple array-camera modules can be fabricated at the same time, for example, in a wafer-level process. Generally, a wafer refers to a substantially disk- or plate-like shaped item, its extension in one direction (y-direction or vertical direction) is small with respect to its extension in the other two directions (x- and z- or lateral directions). On a (non-blank) wafer, multiple similar structures or items can be arranged, or provided therein, for example, on a rectangular or other shaped grid. A wafer can have openings or holes, and in some cases a wafer may be free of material in a predominant portion of its lateral area. In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. The wafer thickness can be, for example, between 0.2 mm and 10 mm, and in some cases, is between 0.4 mm and 6 mm.

In some implementations of a wafer level process, there can be provisions for at least ten modules in each lateral direction, and in some cases at least thirty or even fifty or more modules in each lateral direction. Examples of the dimensions of each of the wafers are: laterally at least 5 cm or 10 cm, and up to 30 cm or 40 cm or even 50 cm; and vertically (measured with no components arranged thereon) at least 0.2 mm or 0.4 mm or even 1 mm, and up to 6 mm or 10 mm or even 20 mm.

Figure 4:
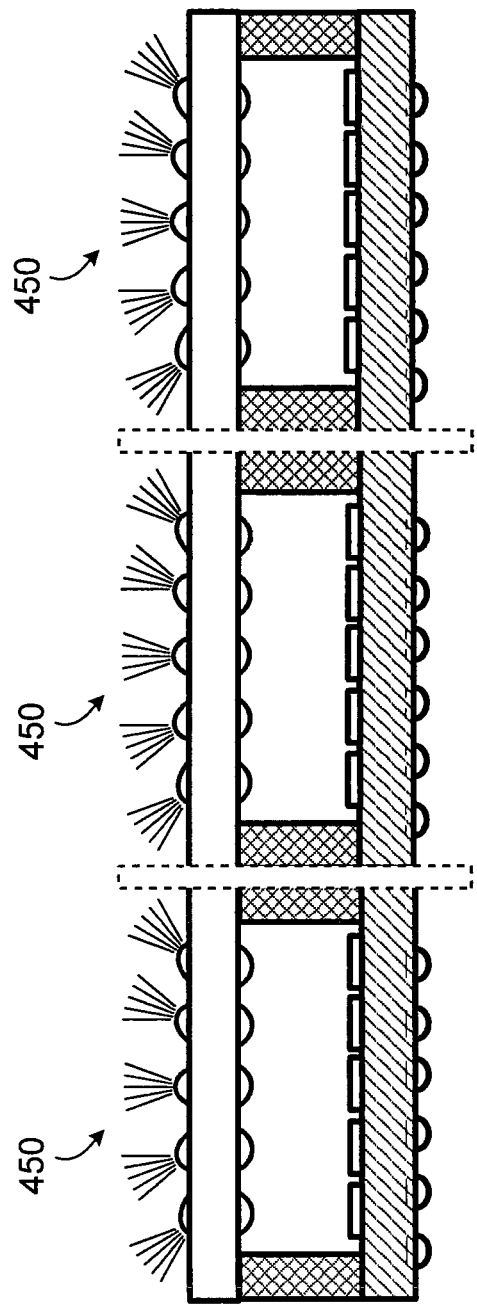
FIG. 4 is a schematic illustrating a side-view of a wafer stack containing multiple array camera modules.

A schematic depicting an example of multiple array-camera modules 450 fabricated by a wafer-level process is shown in FIG. 4. Each of the array camera modules 450 can include a lens module having one or more catadioptric optical channels. The dashed line regions between camera modules 450 correspond to the area that is cut during wafer processing to separate the modules 450 from one another.

Figure 5:
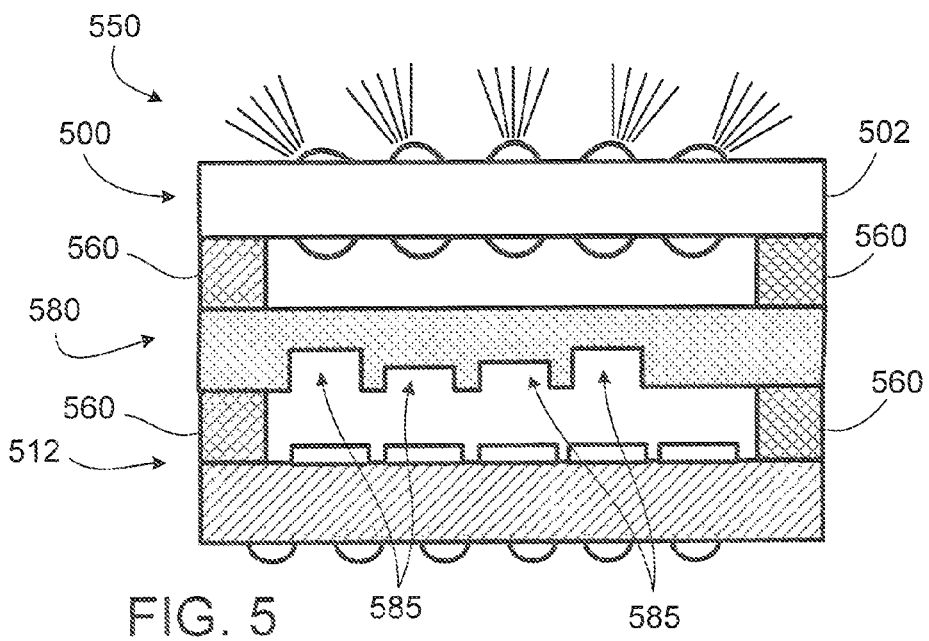
FIG. 5 is a schematic illustrating a side-view of an array camera module containing a channel flange field focal length (FFL) correction layer.

FIG. 5 illustrates another example of an array camera module 550 that incorporates a lens array 500 as well as a flange focal length (FFL) correction substrate 580 that form one or more catadioptric optical channels. The FFL correction substrate 580 can be composed, for example, of a transparent material that allows light within a particular wavelength range to pass with little or no attenuation. The FFL substrate 580 can be separated from the lens substrate 502 by a non-transparent spacer 560. Prior to attaching the image-sensor array 512, the thickness of the FFL correction substrate 580 at positions 585 corresponding to particular optical channels can be adjusted to correct for differences in the FFL of the optical channels. The image-sensor array 512 can be separated from the FFL correction substrate 580, for example, by another non-transparent spacer 560. In some implementations, the length of the FFL correction substrate 580 can also be adjusted in order to correct FFL offsets.

Figure 6:
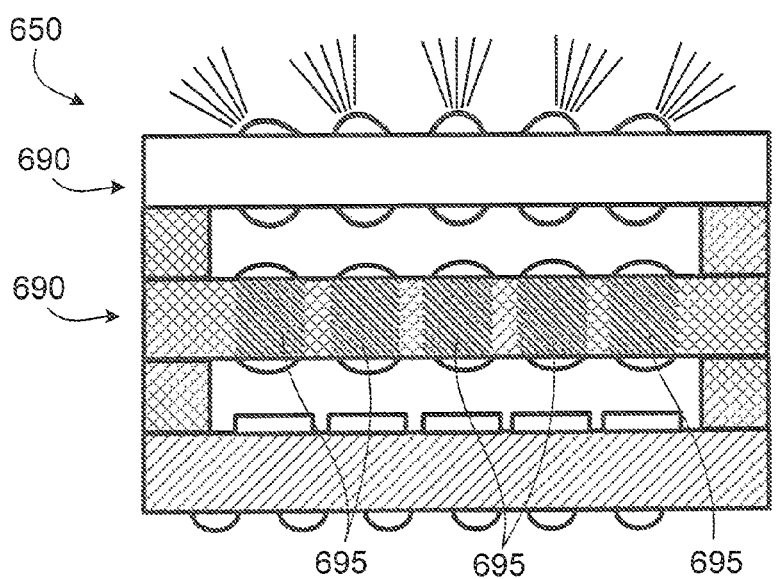
FIG. 6 is a schematic illustrating a side-view of an array camera module containing an optical filter layer.

As shown in FIG. 6, an array-camera module 650 can be formed as a vertical stack that includes one or more optical component substrates 690, each of which includes an array of optical elements (e.g., lenses, color filters) on one or both sides. At least one of the optical channels formed by the multiple substrates includes a catadioptric optical channel, such as the catadioptric channels described herein. The substrate 690 may be non-transparent to the specified wavelength or range of wavelengths and include one or more regions 695 that are transparent to at least the specified wavelength or a subset of the range of wavelengths. For example, the substrate 690 may be composed, for example, of a polymer material (e.g., epoxy, acrylate, polyurethane, or silicone) containing a non-transparent filler (e.g., a pigment, inorganic filler, or dye), whereas the transparent regions 695 may be formed, for example, by etching or drilling openings in the substrate 690. One or more optical components, such as additional lenses, may be secured in the openings in regions 695. Alternatively, color filters can be embedded within or provided on the transmissive portions 695 of the substrate 690 so that different optical channels are associated with different colors (e.g., red, green or blue).

Figure 7:
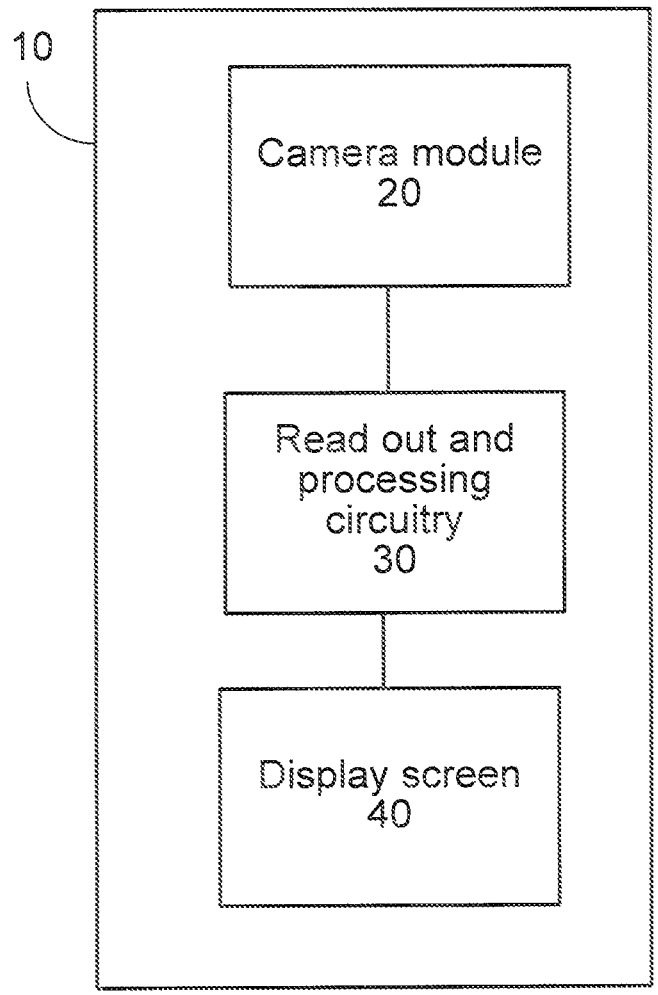
FIG. 7 is a schematic of an example electronic device into which an array-camera module is integrated.

As shown in FIG. 7, a mobile phone, a headset, a media tablet, eyewear, a watch, an electronic product for a gaming application, a camera, a television or other electronic device 10 into which an array-camera module 20 (e.g., the array-camera modules 350, 550 or 650) is integrated can include circuitry 30 for reading out and processing signals from the image sensor of the module 20. Such circuitry can include, for example, one or more data buses, as well as column and row address decoders to read out signals from individual pixels in the image sensor of the module 20. The circuitry can include, for example, analog-to-digital converters, sub-image pixel inverters, and/or non-volatile memory cells, as well multiplexers and digital clocks. Among other things, based on output signals from sub-groups of the photodetectors in the image sensor that detect optical signals passing through the lenses in the lens array of the array-camera module, the circuitry can obtain depth information using known techniques (e.g., based on the parallax effect). The circuitry can process the signals from all the pixels in the image sensor to form a single composite image that can be displayed, for example, on the mobile phone's display screen 40.

Various modifications can be made within the scope of the invention. Accordingly, other embodiments are within the scope of the following claims.

What is claimed is:

1. A lens module comprising:
a substrate;
a first array of passive optical elements on the substrate, the first array including a reflective optical element; and
a second array of passive optical elements separate from the first array, the second array including a refractive optical element, and the optical elements of the first array and the optical elements of the second array forming a plurality of optical channels wherein each particular one of the passive optical elements in the first array of lenses is configured to redirect incident light to a corresponding one of the passive optical elements of the second array in a same one of the optical channels as the particular passive optical element in the first array,
wherein at least one optical channel is a catadioptric optical channel comprising the reflective optical element and the refractive optical element, the reflective optical element being arranged to reflect light toward the refractive optical element,
wherein each optical channel has a corresponding field-of-view, and
wherein the lens module has an overall field of view defined by the range of angles subtended by the field-of-view of the plurality of optical channels.

2. The lens module of claim 1, wherein the field-of-view of each optical channel is smaller than the overall field-of-view.

3. The lens module of claim 1, wherein the reflective optical element is a passive optical element from the first array, and wherein the refractive optical element is a passive optical element from the second array.

4. The lens module of claim 1, wherein each passive optical element in the first array is configured to redirect incident light through the substrate to a second side of the substrate opposite the first side.

5. The lens module of claim 4, wherein the second array of passive optical elements is arranged on the second side of the substrate.

6. The lens module of claim 4, wherein the substrate comprises a plurality of regions transmissive to light, and wherein each region is aligned between a first optical element and a second optical element of a corresponding optical channel.

7. The lens module of claim 6, wherein at least one transmissive region comprises a filter that allows a specified wavelength or range of wavelengths to pass through.

8. The lens module of claim 7, wherein the substrate comprises a plurality of blocking portions separating the transmissive regions from one another, and wherein the blocking portions are substantially non-transparent to the wavelengths of the incident light.

9. The lens module of claim 1, wherein at least a portion of the reflective optical element comprises a reflective thin film.

10. The lens module of claim 1, wherein the reflective optical element is configured to redirect light to the refractive optical element by total internal reflection.

11. The lens module of claim 1, wherein the reflective optical element is a prism.

12. An array camera module comprising:
a base layer comprising an array of light-detecting elements on a surface of the base layer, each light-detecting element being configured to detect a specified wavelength or range of wavelengths;
a lens module comprising
a substrate,
a first array of passive optical elements arranged on a first side of the substrate, the first array including a reflective optical element, and
a second array of passive optical elements separate from the first array, the second array including a refractive optical element, and the optical elements of the first array and the optical elements of the second array forming a plurality of optical channels, each optical channel having a corresponding field-of-view, wherein at least one optical channel is a catadioptric optical channel comprising the reflective optical element and the refractive optical element, the reflective optical element being arranged to reflect light toward the refractive optical element,
wherein the lens module has an overall field of view defined by the range of angles subtended by the field-of-view of each lens of the plurality of optical channels; and
a spacer separating the base layer from the lens module, the spacer serving as a wall that surrounds the light-detecting elements.

13. The array camera module of claim 12, wherein the reflective optical element comprises a reflective thin film for reflecting the specified wavelength or range of wavelengths.

14. The array camera module of claim 12, wherein the reflective optical element is configured to redirect light having the specified wavelength or range of wavelengths to the refractive optical element by total internal reflection.

15. The array camera module of claim 12, wherein the field-of-view of each optical channel in the first array is smaller than the overall field-of-view.

16. The array camera module of claim 12, wherein each optical channel is configured to redirect incident light having the specified wavelength or range of wavelengths to a corresponding light-detecting element on the base layer.

17. The array camera module of claim 12, wherein the second array of passive optical elements is arranged on a second side of the substrate opposite the first side of the substrate.

18. The array camera module of claim 12, wherein the spacer defines a transparent region between the lens module and the base layer through which light redirected from the lens module passes to the base layer.

19. The array camera module of claim 18, wherein the spacer serves as sidewalls of the module that are substantially non-transparent to a specific wavelength or range of wavelengths.

20. The array camera module of claim 12, wherein the base layer comprises a printed circuit board (PCB) and the array of light-detecting elements is electrically connected to a conductive pattern in the PCB.

21. The array camera module of claim 12, further comprising a channel flange focal length (FFL) correction layer between the lens module and the base layer, the optical axes of the optical channels intersecting the channel FFL layer, wherein respective portions of the channel FFL correction layer intersected by the optical axes have different thicknesses from one another.

22. The array camera module of claim 12, wherein the reflective optical element is a lens.

23. The array camera module of claim 12, wherein the reflective optical element is a prism.

24. An electronic device comprising a camera system, wherein the camera system includes an array camera module according to claim 12.

25. A method of fabricating a lens module, the method comprising:
providing a substrate;
arranging a first plurality of passive optical elements on a first side of the substrate into a first array, the first array including a reflective optical element; and
arranging a second plurality of passive optical elements into a second array, such that a plurality of optical channels are formed, the second array including a refractive optical element, each optical channel comprising a passive optical element from the first array and a passive optical element from the second array such that each particular one of the passive optical elements in the first array of lenses is configured to redirect incident light to a corresponding one of the passive optical elements of the second array in a same one of the optical channels as the particular passive optical element in the first array,
wherein at least one optical channel is a catadioptric optical channel comprising the reflective optical element and the refractive optical element,
wherein each optical channel has a corresponding field-of-view, and
wherein the plurality of optical channels defines an overall field-of-view for the lens module.

26. The method of claim 25, wherein arranging the first plurality of passive optical elements comprises forming the first plurality passive optical elements on the substrate by a replication technique or glass molding technique.

27. The method of claim 26, further comprising depositing a reflective coating on a portion of at least one of the passive optical elements of the first array.

28. The method of claim 27, wherein depositing the reflective coating occurs after arranging the first plurality of passive optical elements on the first side of the substrate.

29. The method of claim 27, wherein depositing the reflective coating occurs before arranging the first plurality of passive optical elements on the first side of the substrate.

30. The method of claim 25, wherein the substrate comprises a plurality of transmissive portions transparent to a specified wavelength or range of wavelengths, and wherein arranging the first plurality of passive optical elements comprises arranging each passive optical element of the first array over a corresponding transmissive portion of the substrate.

31. The method of claim 25, wherein the second plurality of passive optical elements are arranged on a second side of the substrate opposite to the first side of the substrate.

32. The method of claim 31, wherein arranging the second plurality of passive optical elements comprises forming the second plurality of passive optical elements on the second side of the substrate by a replication technique, by an injection molding or by a glass molding technique.

33. The method of claim 31, wherein arranging the second plurality of passive optical elements comprises aligning one or more of the second plurality of passive optical elements with one or more corresponding passive optical elements of the first array to form at least one optical channel.

34. A method of manufacturing an array camera module, the method comprising:
providing a base wafer on which are mounted a plurality of light-detecting elements;
providing a lens wafer over the base wafer to form a wafer stack, the lens wafer comprising a substrate and a plurality of optical channels, each optical channel comprising a first passive optical element and a second passive optical element, the first passive optical element of each optical channel being arranged to redirect light to the second passive optical element in the same channel, wherein at least one optical channel is a catadioptric optical channel comprising a reflective optical element as the first passive optical element for that optical channel and a refractive optical element as the second passive optical element for that optical channel;
providing a spacer between the base wafer and the lens wafer, the spacer serving as a wall that surrounds the light-detecting elements; and
dividing the wafer stack into individual array camera modules, each array camera module comprising two or more light-detecting elements and a lens array.

35. The method of claim 34, further comprising manufacturing at least a portion of the lens wafer by a replication technique, by an injection molding or by a glass molding technique.

36. The method of claim 34, further comprising providing a channel flange focal length (FFL) correction layer between the base wafer and the lens wafer.

37. The method of claim 34, further comprising providing one or more optical filter layers on the base wafer, the one or more optical filters covering corresponding light-detecting elements, wherein the one or more optical filters are configured to block transmission of light having a specified wavelength or range of wavelengths.

38. The method of any one of claim 34-35 or 36-37, wherein dividing the wafer stack comprises dicing through the spacer.

* * * * *